(12) United States Patent
Behziz et al.

(10) Patent No.: US 7,890,822 B2
(45) Date of Patent: Feb. 15, 2011

(54) TESTER INPUT/OUTPUT SHARING

(75) Inventors: Arash Behziz, Thousand Oaks, CA (US); Grady Borders, West Hills, CA (US)

(73) Assignee: Teradyne, Inc., North Reading, MA (US)

( * ) Notice: Subject to any disclaimer, the term of this patent is extended or adjusted under 35 U.S.C. 154(b) by 665 days.

(21) Appl. No.: 11/731,392

(22) Filed: Mar. 30, 2007

(65) Prior Publication Data

US 2008/0086664 A1    Apr. 10, 2008

Related U.S. Application Data

(60) Provisional application No. 60/848,549, filed on Sep. 29, 2006.

(51) Int. Cl.
*G11C 29/00* (2006.01)
*G01R 31/28* (2006.01)
*G01R 31/26* (2006.01)

(52) U.S. Cl. .................. 714/724; 365/201; 324/765

(58) Field of Classification Search .............. None
See application file for complete search history.

(56) References Cited

U.S. PATENT DOCUMENTS

| | | | |
|---|---|---|---|
| 5,049,814 A | 9/1991 | Walker, III et al. | |
| 5,606,567 A | 2/1997 | Agrawal et al. | |
| 5,748,642 A | 5/1998 | Lesmeister | |
| 5,794,175 A * | 8/1998 | Conner | 702/119 |
| 5,964,894 A * | 10/1999 | Kurihara | 714/738 |
| 6,263,463 B1 * | 7/2001 | Hashimoto | 714/724 |
| 6,366,112 B1 | 4/2002 | Doherty et al. | |
| 6,404,218 B1 | 6/2002 | Le et al. | |
| 6,499,121 B1 * | 12/2002 | Roy et al. | 714/724 |
| 6,559,671 B2 * | 5/2003 | Miller et al. | 324/765 |
| 6,842,022 B2 | 1/2005 | Khoche | |
| 6,959,257 B1 | 10/2005 | Larky et al. | |
| 7,453,258 B2 * | 11/2008 | Miller | 324/158.1 |
| 2002/0070725 A1 | 6/2002 | Hilliges | |

(Continued)

FOREIGN PATENT DOCUMENTS

WO      WO 00/52488 A      9/2000

OTHER PUBLICATIONS

PCT International Searching Authority-European Patent Office, International Search Report (ISR) for PCT/US2007/020692, mailed Jun. 3, 2008; 3 pages.

*Primary Examiner*—Jeffrey A Gaffin
*Assistant Examiner*—Guerrier Merant
(74) *Attorney, Agent, or Firm*—Wolf, Greenfield & Sacks, P.C.

(57) ABSTRACT

In one implementation, a method of testing multiple DUTs using a single tester channel is provided which includes providing an input signal with the single tester channel simultaneously to each of the DUTs. The method further includes providing a clock signal to each of the DUTs. The clock signal provided to each of the DUTs may be successively delayed clock signals, which are provided to successive DUTs. The method includes using the clock signal to cause a next DUTs to provide an output transition before an output of a prior DUT is returned to a pre-transition state. The method further includes detecting with the single tester channel the output transition of each of the DUTs in response to the input signal and the clock signal.

36 Claims, 3 Drawing Sheets

U.S. PATENT DOCUMENTS

2003/0234659 A1* 12/2003 Zieleman ................... 324/765
2004/0199838 A1 10/2004 Rutkowski
2005/0278598 A1* 12/2005 Yatsuka ...................... 714/742
2006/0049820 A1* 3/2006 Miller ..................... 324/158.1

* cited by examiner

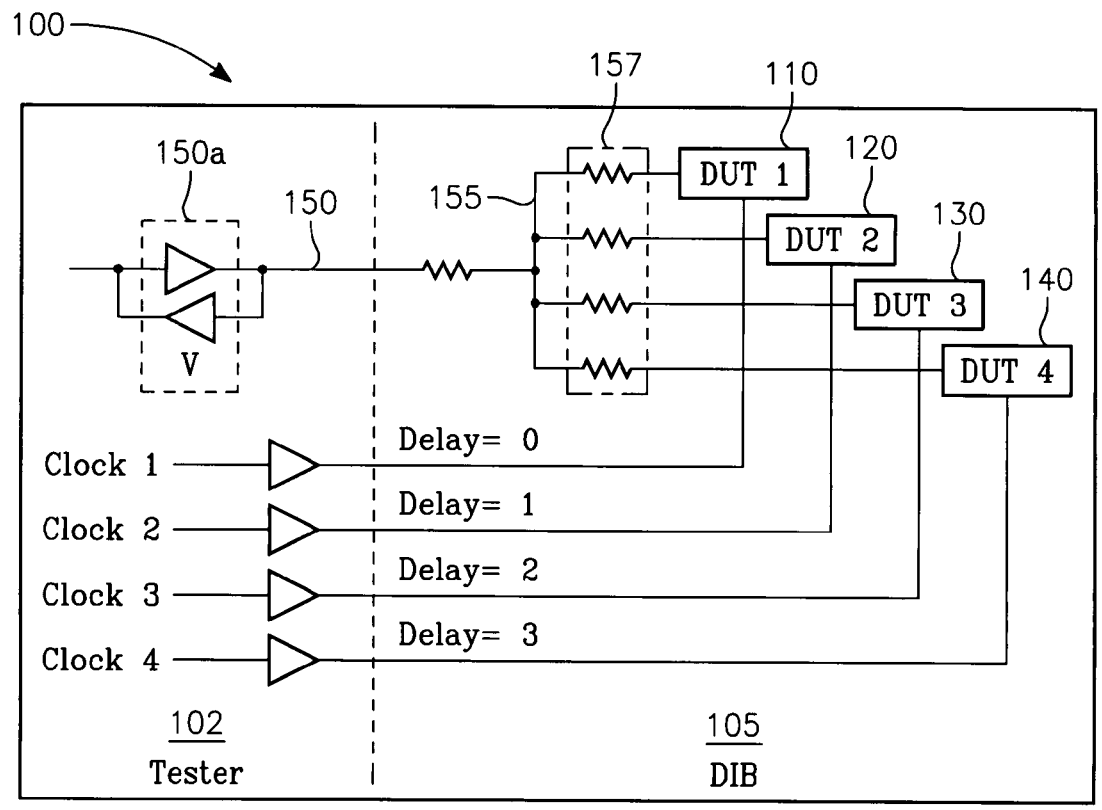
FIG. 1
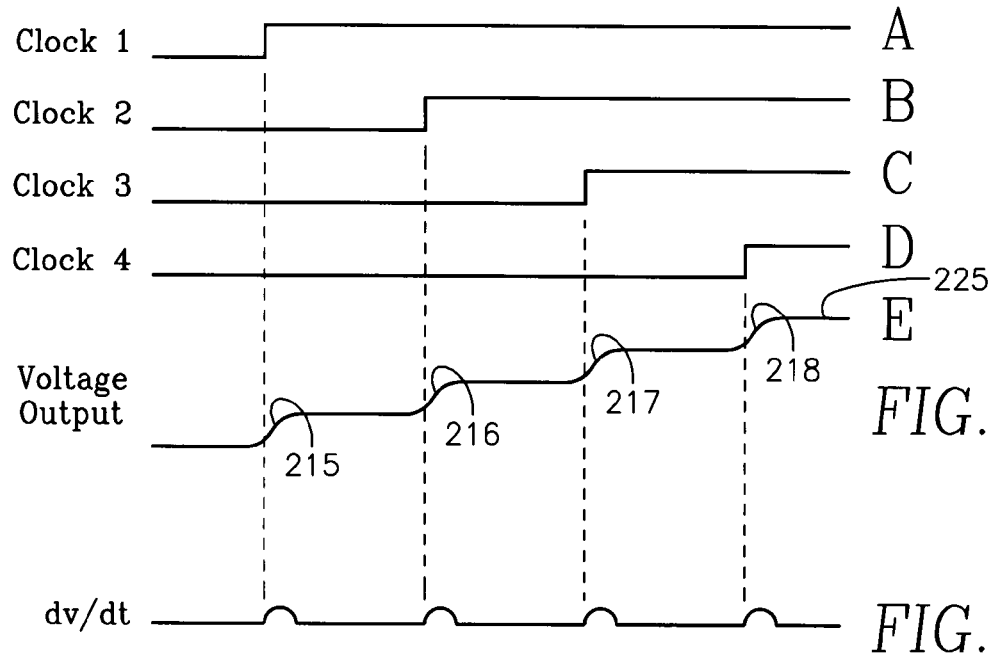
FIG. 2
FIG. 3

TESTER INPUT/OUTPUT SHARING

CROSS REFERENCE TO RELATED APPLICATION

This application claims the benefit of U.S. Provisional Application No. 60/848,549, filed on Sep. 29, 2006, by Behziz, et al., entitled TESTER INPUT/OUTPUT SHARING, herein incorporated by reference in its entirety.

BACKGROUND

In conventional testing of bi-directional signals, each device under test or DUT channel, for example each pin, is separately tested using a single channel of a tester. Thus, there is a one to one correlation between tester channels and DUT channels. If the DUT channel only receives input, a single tester channel may be used to simultaneously test multiple channels of the DUT. This is possible because the data is communicated in only one direction. Therefore, the data can be fanned out from one channel to several channels, i.e. from one tester channel to several pins of a DUT. What is needed is a test method and apparatus capable of bi-directional signal communication. Further, what is needed is a test method and apparatus capable of bi-direction communication between a single tester channel and multiple DUT channels.

SUMMARY

In one implementation, a method for testing multiple devices under test using a single tester channel is provided which includes providing an input signal with the single tester channel simultaneously to each of the devices under test. The method further includes providing a clock signal to each of the devices under test. The clock signal provided to each of the devices under test may be successively delayed clock signals, which are provided to successive devices under test. The method includes using the clock signal to cause a next device under test to provide an output transition before an output of a prior device under test is returned to a pre-transition state. The method further includes detecting with the single tester channel the output transition of each of the devices under test in response to the input signal and the clock signal.

In some implementations, the method includes providing an input signal with the single tester channel simultaneously to each of the devices under test, using a series-to-parallel connection on a device interface board to connect the single tester channel to the plurality of devices under test. In some implementations, the method includes providing an input signal with the single tester channel simultaneously to each of the devices under test using a series-to-parallel connection located in a test head.

In some implementations, the method includes measuring a cumulative response. In some implementations the method includes detecting an incremental change in a cumulative output of the plurality of devices under test. In some implementations, detecting comprises detecting a rate of change of the output.

In one embodiment, an automated tester capable of bi-directional testing of multiple devices under test using a single tester channel is provided. The automated tester includes a test channel having a bi-directional input and output circuit and a series to parallel circuit configured so as to be capable of connecting the bi-directional input and output circuit to multiple devices under test. The tester includes clock circuits, each being configured for connection to a device under test. A processor is configured to cause the tester to perform bi-directional testing of the devices under test with the test channel by providing an input signal with the test channel simultaneously to each of the devices under test, by providing a clock signal to each of the devices under test, by causing a next device under test to provide an output transition before an output of a prior device under test is returned to a pre-transition state using the clock signal, and by detecting with the test channel the output transition of each of the plurality of devices under test in response to the input signal and the clock signal. Further, the tester may be adapted such that it provides successively delayed clock signals to successive devices under test.

In some embodiments, the automated tester is adapted to measure a cumulative response output of the plurality of devices under test. In some embodiments, the automated tester is adapted to detect an incremental change in a cumulative response output of the devices under test. In some embodiments, the automated tester is adapted to detect a rate of change of the output.

Some embodiments include a device interface board adapted to hold the plurality of devices under test, the series-to-parallel connection being located on the device interface board. In some embodiments, the series-to-parallel connection is located between the bi-directional input and output circuit and the device interface board. A resistor is located between the series-to-parallel connection and each of the plurality of devices under test.

BRIEF DESCRIPTION OF THE DRAWINGS

The features and advantages of the present invention will be better understood with regard to the following description, appended claims, and accompanying drawings where:

FIG. 1 is a simplified schematic illustration showing an automated tester capable of bi-directional testing of multiple devices under test using a single tester channel.

FIG. 2 shows a timing diagram showing the magnitude of the output voltage on the tester channel in accordance with one possible implementation of the present invention.

FIG. 3 shows a timing diagram showing the dv/dt of the voltage output on the tester channel.

DESCRIPTION

Figure 4:
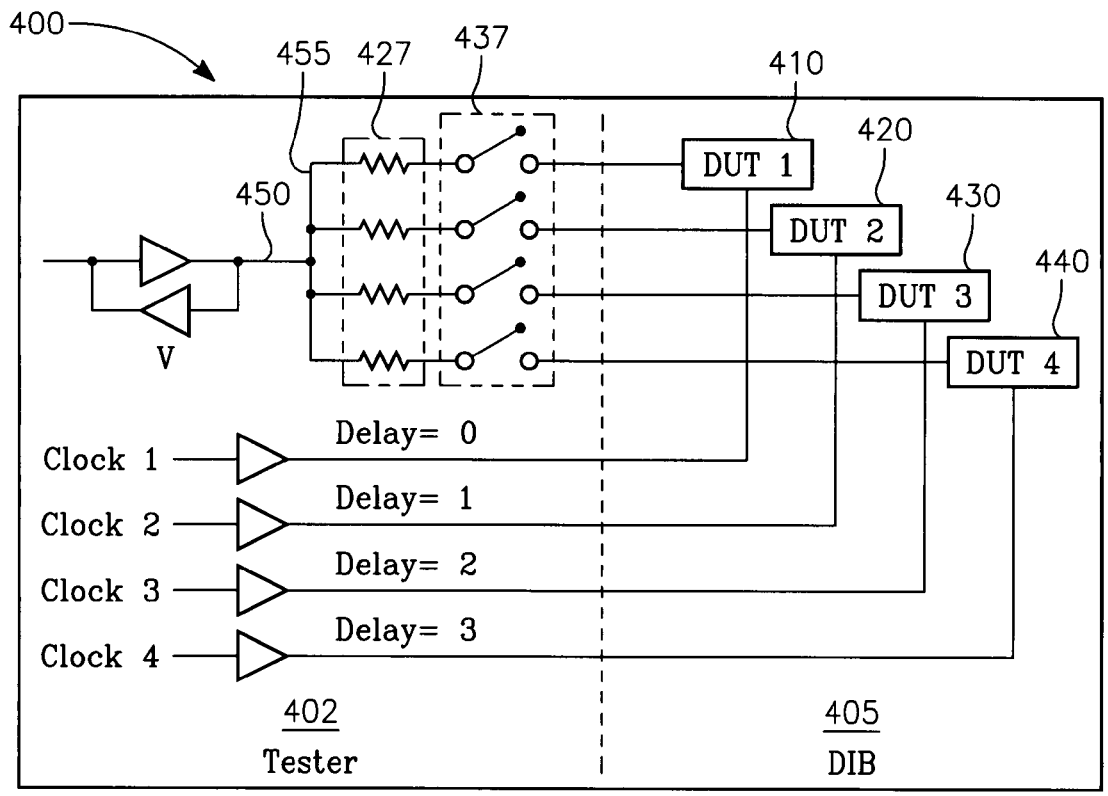
FIG. 4 is a simplified schematic illustration showing another embodiment of an automated tester capable of bi-directional testing of multiple devices under test using a single tester channel.

FIG. 1 is a simplified schematic illustration showing an automated tester 100 capable of bi-directional testing of multiple devices under test or DUTs 110, 120, 130, and 140, using a single tester channel 150. The DUTs 110, 120, 130 and 140 are connected in parallel to the tester channel 150. In the embodiment of FIG. 1, a series-to-parallel circuit 155 is provided on the device interface board or DIB 105. In this embodiment, the series-to-parallel circuit 155 includes resistors 157 located on the DIB 105 between the series-to-parallel circuit 155 and each of the DUTs 110, 120, 130 and 140.

An input signal is communicated to all the DUTs 110, 120, 130, and 140 via the tester channel 150. Clock signals labeled Clock 1, Clock 2, Clock 3, and Clock 4 are connected to the DUTs 110, 120, 130, and 140, respectively. The clock signals Clock 1, Clock 2, Clock 3, and Clock 4 cause the DUTs to transition their outputs. The transitions of the clock signals Clock 1-4 are spaced close in time to cause individual DUTs to provide output transitions while other DUTs are still providing a transitioned output to the tester channel 150. The clock signals Clock 2, Clock 3, and Clock 4 may be delayed by a period that is shorter than the normal operating frequency of the tester clock signal. Thus, the output of a DUT need not be returned to its pre-transitioned state, i.e. to ground, before a clock signal causes a next DUT to transition.

For example, Clock 1 may have a delay of zero, Clock 2 a delay of 1, Clock 3 a delay of 2, Clock 4 a delay of 3, and so on, corresponding to the number of DUTs. Each delay, or the cumulative total of the delays, may be shorter than the time required to return the outputs of the DUTs to their pre-transition state, i.e. back to zero. A combined output of the DUTs on the single tester channel 150 is detected and/or measured. This is illustrated in FIG. 2.

FIG. 2 shows a timing diagram showing the magnitude of the output voltage on the tester channel 150 in accordance with one possible implementation of the present invention. In this implementation, the Clock 1, Clock 2, Clock 3, and Clock 4 are successively delayed so that the voltage output combines on the tester channel 150. The voltage output transitions associated with each transition of the clock signals, Clock 1, Clock 2, Clock 3, and Clock 4, are detected in the tester 102 by the tester electronics (only the input/output driver circuit 150a is shown). In some implementations, it is only necessary to detect that a change in output voltage has occurred without measuring the cumulative voltage. For example, in one embodiment, the last state of the cumulative output voltage level is stored in hardware, and then compared to the output voltage level after a clock transition to detect whether the DUT is functioning properly. In some implementations, transitions 215, 216, 217, and 218 in the output voltage level, shown in Plot E, are detected and/or measured to determine functionality the individual DUTs 110, 120, 130, and 140.

In some implementations, it is possible to measure the cumulative output 225 of the DUTs shown on Plot E of FIG. 2 to determine whether each of the DUTs are performing correctly. Typically, each of the DUTs will provide an equal contribution to the overall voltage output. Thus, whether an output voltage level is detected and/or measured at individual transitions 215, 216, 217, and 218, or cumulatively, a single channel 150 may be used to determine the functionality of the DUTs, 110, 120, 130, and 140.

FIG. 3 shows a timing diagram showing the first derivative or dv/dt of the voltage output on the tester channel 150 (shown in FIG. 1) corresponding to the clock signals of FIG. 2. In this implementation the detected output gives and indication of whether a change of the output signal occurred (the rate of change of the output signal), without regard to the amplitude of the change. In some embodiments, this may be sufficient. In this way, if any of the DUTs 110, 120, 130, and 140, changes the state of its output, it can be detected and/or the slope of the change measured on the tester channel 250.

Although the clock signals Clock 1, Clock 2, Clock 3, and Clock 4 are illustrated as latched signals, this is not necessary. The clock signals Clock 1, Clock 2, Clock 3, and Clock 4, may be pulsed signals that return to zero after transitioning. If a clock signal returns to zero and causes a DUT output to return to zero, the criteria for a proper cumulative response measured on the tester channel 250 would take this into account. Moreover, in implementations where dv/dt is detected, any negative values would indicate negative sloped voltage transitions when the output of a DUT returns to zero.

FIG. 4 is a simplified schematic illustration showing another embodiment of an automated tester 400 capable of bi-directional testing of multiple DUTs 410, 420, 430, and 440, using a single tester channel 450. In this embodiment, series-to-parallel circuit 455 is located in the tester 402 rather than in the DIB 405. Further, in this embodiment, it is possible to locate the resistors 427 in the tester 402 rather than the DIB 405.

FIG. 4 is illustrated with optional switches, such as relays 437, located between the series-to-parallel circuit 455. The relays 437 may be located in the tester 102, or on the DIB, provided there is sufficient space available on the DIB 405. The relays 437 allow a particular DUT to be removed from connection with the tester channel 450, if a malfunction is detected.

Figure 5:
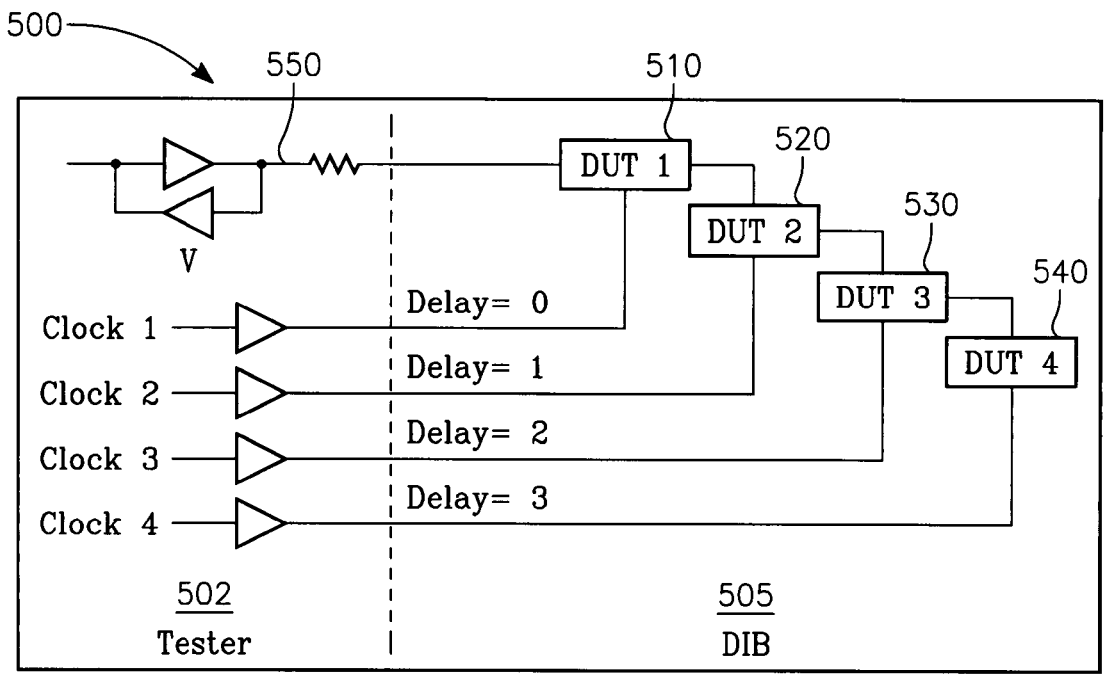
FIG. 5 is a simplified schematic illustration showing another embodiment of an automated tester capable of bi-directional testing of multiple series connected devices under test using a single tester channel.

FIG. 5 is a simplified schematic illustration showing another embodiment of an automated tester 500 capable of bi-directional testing of multiple DUTs 510, 520, 530, and 540, using a single tester channel 550. In this embodiment, the DUTs 510, 520, 530, and 540 are connected in series with each other so that the output of DUT 540 is connected to the input of DUT 530, the output of DUT 530 is connected to the input of DUT 520, the output of DUT 520 is connected to the input of DUT 510, and DUT 510 is connected in series with the tester channel 550. This embodiment takes advantage of the capability of the DUT to avoid damage due to the inherent resistance of the DUTs.

Although in the configuration of FIG. 5, a shorted DUT could ruin or destroy other DUTs, the present inventors have found that due to the infrequency of such an occurrence, that the increase in test speed makes this approach practical for a certain types of DUTs. For example, it could be used to test lower cost microprocessors, RAM, etc., where the loss of several DUTs is infrequent and an acceptable tradeoff.

An advantage of the various embodiments discussed above is that it will increase the test speed. This is because it is possible to test bi-directionally with a single channel without requiring that the output be returned to its original state before testing a next device.

An advantage of various embodiments is that the number of channels in the tester can be reduced, reducing tester cost. A further advantage of some embodiments of FIGS. 1 and 4 is that they allow the number of interconnects between the tester 102 and the DIB 105 to be reduced, thereby reducing the size of the interface between the tester 102 and the DIB 105. This allows the cost of the automated tester to be reduced.

Figure 6:
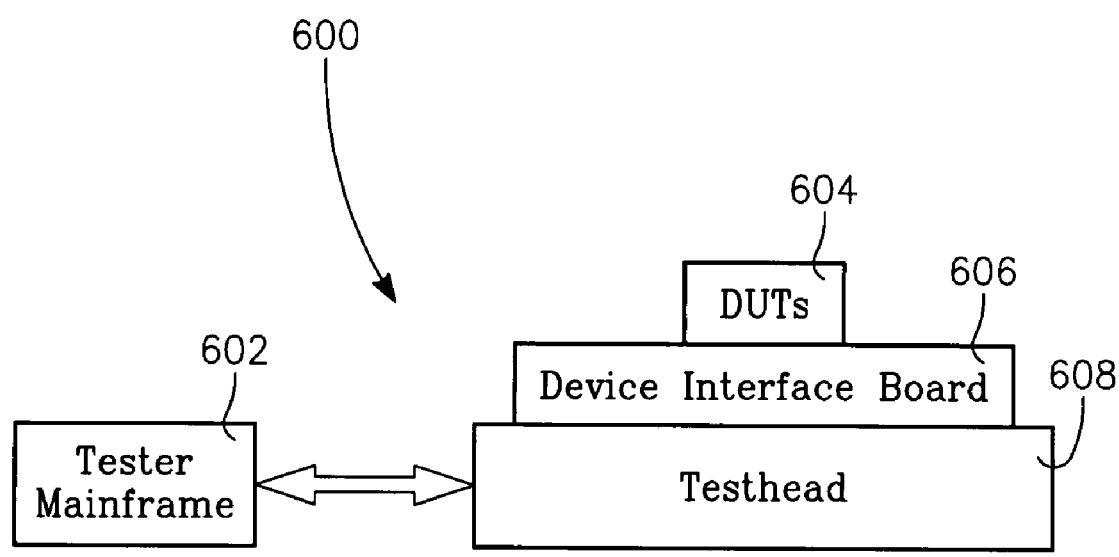
FIG. 6 shows a block diagram of a possible embodiment of an automated tester.

FIG. 6 shows a block diagram of a possible embodiment of an automated tester 600. In the embodiment shown, the tester 600 includes a tester mainframe 602 and a testhead 608. In some embodiments of the automated tester 600, the input/output circuit 150a of the pin electronics circuitry (referred to with reference FIG. 1 above) may be located in the test head 608. The clock signals, referred to above, may be generated in the tester mainframe 602, and the clock delay circuitry may be located with the pin electronics in the test head 608, in some embodiments.

The series-to-parallel circuit 155 and the resistors 157 (discussed above with reference to FIG. 1) may be located in the device interface board 606, or in the testhead 608. Multiple DUTs 604 are mounted with the DIB 606.

Having described this invention in connection with a number of embodiments, modification will now certainly suggest itself to those skilled in the art. As such, the invention is not limited to the disclosed embodiments, except as required by the appended claims. One or more of the embodiments above

What we claim is:

1. A method of testing in an automated tester, the method comprising:
testing a plurality of devices under test using a single tester channel comprising:
providing an input signal simultaneously to each of the plurality of devices under test using the single tester channel;
providing successively delayed clock signals to successive devices under test;
detecting with the single tester channel a cumulative output from the plurality of devices under test using the single tester channel; and
based on the cumulative output determining, for each of the plurality of devices under test, a response of the device under test to the input signal.

2. The method of claim 1, wherein providing the input signal simultaneously to each of a plurality of devices under test comprises using a series-to-parallel connection on a device interface board to connect the single tester channel to the plurality of devices under test.

3. The method of claim 2, wherein providing the input signal simultaneously to each of a plurality of devices under test further comprises providing a switch connected between the series-to-parallel connection and each of the plurality of devices under test.

4. The method of claim 1, wherein providing the input signal simultaneously to each of a plurality of devices under test further comprises providing a series-to-parallel connection prior to a device interface board to connect the single tester channel to the plurality of devices under test.

5. The method of claim 4, wherein providing the input signal simultaneously to each of a plurality of devices under test further comprising providing a resistor between the series-to-parallel connection and each of the plurality of devices under test.

6. The method of claim 5, wherein providing the input signal simultaneously to each of a plurality of devices under test further comprising providing a switch between the series-to-parallel connection and each of the plurality of devices under test.

7. The method of claim 1, wherein the successively delayed clock signals have relative delays causing a next device under test to provide an output transition before an output of a prior device under test is returned to a pre-transition state.

8. The method of claim 1, wherein testing the plurality of devices under test using the single tester channel further comprises providing series connections to connect the plurality of devices under test.

9. An automated tester comprising:
a) a test channel comprising a bi-directional input and output circuit;
b) a series to parallel circuit configured so as to be capable of connecting the bi-directional input and output circuit to a plurality of devices under test;
c) a plurality of clock circuits each configured so as to be capable of being connected to a respective one of the plurality of devices under test; and
d) wherein the tester is configured to perform bi-directional testing of the plurality of devices under test with the test channel by:
providing an input signal with the test channel simultaneously to each of a plurality of devices under test;
causing a next device under test to provide an output transition before an output of a prior device under test is returned to a pre-transition state using successively delayed clock signals provided to successive devices under test;
measuring a cumulative response output of the plurality of devices under test; and
based on the cumulative response output, for each of the plurality of devices under test, determining a response of the device under test to the input signal.

10. The automated tester of claim 9, wherein the tester further comprises a device interface board adapted to hold the plurality of devices under test, and wherein the series-to-parallel connection is located on the device interface board.

11. The automated tester of claim 10 further comprising a resistor connected between the series-to-parallel connection and each of the plurality of devices under test.

12. The automated tester of claim 11 further comprising a switch connected between the series-to-parallel connection and each of the plurality of devices under test.

13. The automated tester of claim 9, wherein the tester further comprises a device interface board adapted to hold the plurality of devices under test, and wherein the series-to-parallel connection is located between the bi-directional input and output circuit and the device interface board.

14. The automated tester of claim 13, wherein the tester further comprises a switch between the series-to-parallel connection and each of the plurality of devices under test.

15. The automated tester of claim 14 further comprising a resistor connected between the series-to-parallel connection and each of the plurality of devices under test.

16. The automated tester of claim 9, wherein the output of the devices under test are connected in series with each other and in series with the test channel.

17. A method of testing in an automated tester, the method comprising:
testing a plurality of devices under test using a single tester channel comprising:
providing an input signal with the single tester channel simultaneously to each of a plurality of devices under test;
providing a clock signal to each of the plurality of devices under test;
using the clock signal to cause a next device under test to provide an output transition before an output of a prior device under test is returned to a pre-transition state; and
detecting with the single tester channel a cumulative response output representing the output transition of each of the plurality of devices under test in response to the input signal and the clock signal.

18. The method of claim 17, wherein providing the clock signal to each of the plurality of devices under test comprises providing successively delayed clock signals to successive devices under test.

19. The method of claim 17, wherein detecting comprises measuring a cumulative response.

20. The method of claim 17, wherein detecting comprises detecting an incremental change in a cumulative output of the plurality of devices under test.

21. The method of claim 17, wherein providing an input signal with the single tester channel simultaneously to each of a plurality of devices under test comprises using a series-to-parallel connection on a device interface board to connect the single tester channel to the plurality of devices under test.

22. The method of claim 21, wherein providing an input signal with the single tester channel simultaneously to each of a plurality of devices under test further comprises providing a switch connected between the series-to-parallel connection and each of the plurality of devices under test.

23. The method of claim 17, wherein providing an input signal with the single tester channel simultaneously to each of a plurality of devices under test further comprises providing a series-to-parallel connection in a test head to connect the single tester channel to the plurality of devices under test.

24. The method of claim 23, wherein providing an input signal with the single tester channel simultaneously to each of a plurality of devices under test further comprising providing a switch between the series-to-parallel connection and each of the plurality of devices under test.

25. The method of claim 17, wherein testing the plurality of devices under test using the single tester channel further comprises providing series connections between the plurality of devices under test.

26. An automated tester comprising:
   a) a test channel comprising a bi-directional input and output circuit;
   b) a series to parallel circuit configured so as to be capable of connecting the bi-directional input and output circuit to a plurality of devices under test;
   c) a plurality of clock circuits each configured so as to be capable of being connected to a respective one of the plurality of devices under test; and
   d) the tester being configured to perform bi-directional testing of the plurality of devices under test with the test channel by:
      providing an input signal with the test channel simultaneously to each of a plurality of devices under test;
      causing a next device under test to provide an output transition before an output of a prior device under test is returned to a pre-transition state; and
      detecting with the test channel a cumulative response signal comprising the output transition of each of the plurality of devices under test in response to the input signal and the clock signal.

27. The automated tester of claim 26, wherein the tester is adapted so as to provide successively delayed clock signals to successive devices under test.

28. The automated tester of claim 26, wherein the tester is adapted so as to measure a cumulative response output of the plurality of devices under test.

29. The automated tester of claim 26, wherein the tester is adapted so as to detect an incremental change in a cumulative response output of the plurality of devices under test.

30. The automated tester of claim 26, wherein the tester is adapted so as to detect a rate of change of the output.

31. The automated tester of claim 26, wherein the tester further comprises a device interface board adapted to hold the plurality of devices under test, and wherein the series-to-parallel connection is located on the device interface board.

32. The automated tester of claim 31, wherein the tester further comprises a resistor between the series-to-parallel connection and each of the plurality of devices under test.

33. The automated tester of claim 26, wherein the tester further comprises a device interface board adapted to hold the plurality of devices under test, and wherein the series-to-parallel connection is located between the bi-directional input and output circuit and the device interface board.

34. The automated tester of claim 33, wherein the tester further comprises a resistor between the series-to-parallel connection and each of the plurality of devices under test.

35. The automated tester of claim 34, wherein the tester further comprises a switch between the series-to-parallel connection and each of the plurality of devices under test.

36. The automated tester of claim 26, wherein the output of the devices under test are connected in series with each other and in series with the test channel.

* * * * *